(12) United States Patent
Saijo (10) Patent No.: US 12,003,945 B2
(45) Date of Patent: Jun. 4, 2024

(54) AUDIO REPRODUCTION DEVICE

(71) Applicant: SONY GROUP CORPORATION, Tokyo (JP)

(72) Inventor: Shinsaku Saijo, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 209 days.

(21) Appl. No.: 17/415,981

(22) PCT Filed: Oct. 9, 2019

(86) PCT No.: PCT/JP2019/039838
§ 371 (c)(1),
(2) Date: Jun. 18, 2021

(87) PCT Pub. No.: WO2020/137082
PCT Pub. Date: Jul. 2, 2020

(65) Prior Publication Data
US 2021/0385603 A1    Dec. 9, 2021

(30) Foreign Application Priority Data

Dec. 28, 2018  (JP) ................. 2018-247467

(51) Int. Cl.
*H04S 7/00* (2006.01)
*H04R 3/00* (2006.01)

(52) U.S. Cl.
CPC .............. *H04S 7/302* (2013.01); *H04R 3/00* (2013.01); *H04S 2400/01* (2013.01)

(58) Field of Classification Search
CPC ... G06F 3/165; G06F 3/162; G11B 20/00007; H04H 20/95; G10L 19/008; G10L 25/48
(Continued)

(56) References Cited

U.S. PATENT DOCUMENTS 9,866,308 B1 *  1/2018  Bultan .................. G01S 3/74
11,234,078 B1 *  1/2022  Silfvast ................ H04S 1/007
(Continued)

FOREIGN PATENT DOCUMENTS

| CN | 1592091 A | 3/2005 |
| CN | 101009952 A | 8/2007 |

(Continued)

OTHER PUBLICATIONS

International Search Report and Written Opinion of PCT Application No. PCT/JP2019/039838, dated Nov. 26, 2019, 07 pages of ISRWO.

(Continued)

*Primary Examiner* — Alexander Krzystan
(74) *Attorney, Agent, or Firm* — CHIP LAW GROUP (57) ABSTRACT

To provide an audio reproduction device including: a signal processing circuit that generates multi-channel audio data; an attenuation amount control unit that is connected to the signal processing circuit and controls an attenuation amount of audio data of each channel; and a speaker device that is driven by a multi-channel audio signal from the attenuation amount control unit and has multi-channel speakers including a woofer, in which the attenuation amount control unit estimates, from an audio data value of each channel, a total value of currents flowing through the speaker device, and controls the attenuation amount in such a way that the estimated total value of currents does not exceed a predetermined value that has been set in advance, and the attenuation amount is controlled in accordance with a priority that has been set in advance in such a way that relationships between the channels are maintained.

9 Claims, 4 Drawing Sheets

(58) Field of Classification Search
USPC .......................... 700/94; 381/106, 107, 108
See application file for complete search history.

(56) References Cited

U.S. PATENT DOCUMENTS

| | | | |
|---|---|---|---|
| 2002/0051546 A1* | 5/2002 | Bizjak | H03G 3/3089 |
| | | | 381/106 |
| 2003/0098805 A1* | 5/2003 | Bizjak | H03G 3/32 |
| | | | 341/139 |
| 2006/0115091 A1 | 6/2006 | Kim | |
| 2010/0232609 A1 | 9/2010 | Sungyoung | |
| 2016/0360315 A1 | 12/2016 | Matsuyama | |

FOREIGN PATENT DOCUMENTS

| | | |
|---|---|---|
| CN | 102172047 A | 8/2011 |
| EP | 3101808 A1 | 12/2016 |
| JP | 2002-198756 A | 7/2002 |
| JP | 2011-217295 A | 10/2011 |
| JP | 2016-225913 A | 12/2016 |

OTHER PUBLICATIONS

Huang Wei, "Multi-channel audio manufacturing technology for high-definition film", Modern television technology, 05, May 15, 2006, pp. 1-5.

* cited by examiner

AUDIO REPRODUCTION DEVICE

CROSS REFERENCE TO RELATED APPLICATIONS

This application is a U.S. National Phase of International Patent Application No. PCT/JP2019/039838 filed on Oct. 9, 2019, which claims priority benefit of Japanese Patent Application No. JP 2018-247467 filed in the Japan Patent Office on Dec. 28, 2018. Each of the above-referenced applications is hereby incorporated herein by reference in its entirety.

TECHNICAL FIELD

The present technology relates to an audio reproduction device that includes multi-channel speakers.

BACKGROUND ART

In order to create realistic feeling, many formats for audio reproduction systems called stereophonic systems, 3D audio, VR audio, or the like have been proposed, and they are designed to perform multi-channel audio reproduction. In order to perform multi-channel audio reproduction, an audio reproduction device with a plurality of speakers integrated for convenience of portability and enjoyment of music outdoors is used.

In a case of this audio reproduction device, a direct-current power supply can be constructed from a commercial power supply, or a battery power supply can be used for operation. A power supply has a protection function that shuts down the power supply when a load current of a predetermined value or more flows. Therefore, also in a case of an audio reproduction device having a multi-channel speaker, the power supply shuts down when a current of a set value or more flows through the multi-channel speaker. The shutdown is activated by turning off of a switching element, blowing of a fuse, or the like.

Patent Document 1 describes that, in a case where a total value of a multi-channel current consumption exceeds a predetermined value, an upper limit value of a limiter unit is lowered preferentially from a channel with the largest predicted current consumption.

CITATION LIST

Patent Document

Patent Document 1: Japanese Patent Application Laid-Open No. 2011-217295

SUMMARY OF THE INVENTION

Problems to be Solved by the Invention

In the case described in Patent Document 1, there has been a problem in that an effect of multi-channel reproduction is impaired because the upper limit value of the limiter unit is lowered preferentially from the channel with the largest predicted current consumption.

It is therefore an object of the present technology to provide an audio reproduction device that prevents, as much as possible, an acoustic effect of multi-channel audio reproduction from being impaired in a case where shutdown of a power supply due to an overcurrent is prevented.

Solutions to Problems

The present technology provides an audio reproduction device including:
a signal processing circuit that generates multi-channel audio data;
an attenuation amount control unit that is connected to the signal processing circuit and controls an attenuation amount of audio data of each channel; and
a speaker device that is driven by a multi-channel audio signal from the attenuation amount control unit and has multi-channel speakers including a woofer,
in which the attenuation amount control unit estimates, from an audio data value of each channel, a total value of currents flowing through the speaker device, and controls the attenuation amount in such a way that the estimated total value of currents does not exceed a predetermined value that has been set in advance, and
the attenuation amount is controlled in accordance with a priority that has been set in advance in such a way that relationships between the channels are maintained.

Furthermore, the present technology provides an audio reproduction device including:
a signal processing circuit that generates multi-channel audio data;
an attenuation amount control unit that is connected to the signal processing circuit and controls an attenuation amount of audio data of each channel; and
a speaker device that is driven by a multi-channel audio signal from the attenuation amount control unit and has multi-channel speakers including a woofer,
in which the attenuation amount control unit estimates, from an audio data value of each channel, a total value of currents flowing through the speaker device, and controls attenuation amounts in such a way that the estimated total value of currents does not exceed a predetermined value allowed by a power supply, and
the attenuation amount control unit performs first determination processing for determining whether the total value of currents exceeds the predetermined value in a case where input data for the woofer is attenuated in a range of up to zero, and causes the input data for the woofer to be attenuated by a required amount in a case where it is determined that the total value of currents does not exceed the predetermined value, and
performs, in a case where it is determined in the first determination processing that the total value of currents exceeds the predetermined value, second determination processing for determining whether the total value of currents exceeds the predetermined value in a case where the input data for the woofer is attenuated to substantially zero, and then input data for the speakers excluding the woofer is attenuated in a range of up to a value that has been set, and causes the input data for the speakers excluding the woofer to be attenuated by a required amount in a case where it is determined that the total value of currents does not exceed the predetermined value.

Effects of the Invention

According to at least one embodiment, the present technology can prevent the power supply from shutting down during audio reproduction. In this case, it is possible to prevent an acoustic effect of audio reproduction from being impaired. Note that the effects described here are not necessarily restrictive, and the effects of the invention may be any of the effects described in the present technology or may be effects different from those.

MODE FOR CARRYING OUT THE INVENTION

Embodiments and the like of the present technology will be described below with reference to the drawings. Note that the embodiments and the like described below are preferred specific examples of the present technology, and the content of the present technology is not limited to these embodiments and the like. Furthermore, in the following description, for the purpose of preventing complication of the illustration, reference numerals may be assigned to only some of components, or some of the components may be illustrated in a simplified manner.

An overall configuration of one embodiment of the present technology will be described with reference to FIG. 1. Input data is supplied to a decoder 1. The input data is stream data in a predetermined format of stereophonic audio such as immersive audio, and the decoder 1 converts the stream data into multi-channel audio data. In the embodiment, the decoder 1 outputs 10-channel audio data. The immersive audio can perform audio reproduction in a desired manner in a height direction and in a plane to provide realistic feeling to a listener.

An output from the decoder 1 is supplied to a postprocessor 2. The postprocessor 2 corrects a signal output from the decoder 1 into a signal that takes into consideration characteristics of a speaker and the like. A signal output from the postprocessor 2 is supplied to a total current controller 3. The total current controller 3 functions as an attenuation amount control unit that attenuates a signal so that a power supply does not shut down.

A signal output from the total current controller 3 is supplied to an amplifier block 4. The amplifier block 4 is connected with a speaker device 5 with, for example, seven channels. The speaker device 5 is constituted by seven speakers arranged as described later. The seven speakers are a top left speaker TL, a top right speaker TR, a top center speaker TC, a side left speaker SL, a side right speaker SR, a side center speaker SC, and a woofer WF. The speakers excluding the woofer WF are full-range reproduction speakers. Note that, as indicated by a surrounding broken line, the decoder 1, the postprocessor 2, and the total current controller 3 constitute a digital signal processor (DSP).

Figure 2:
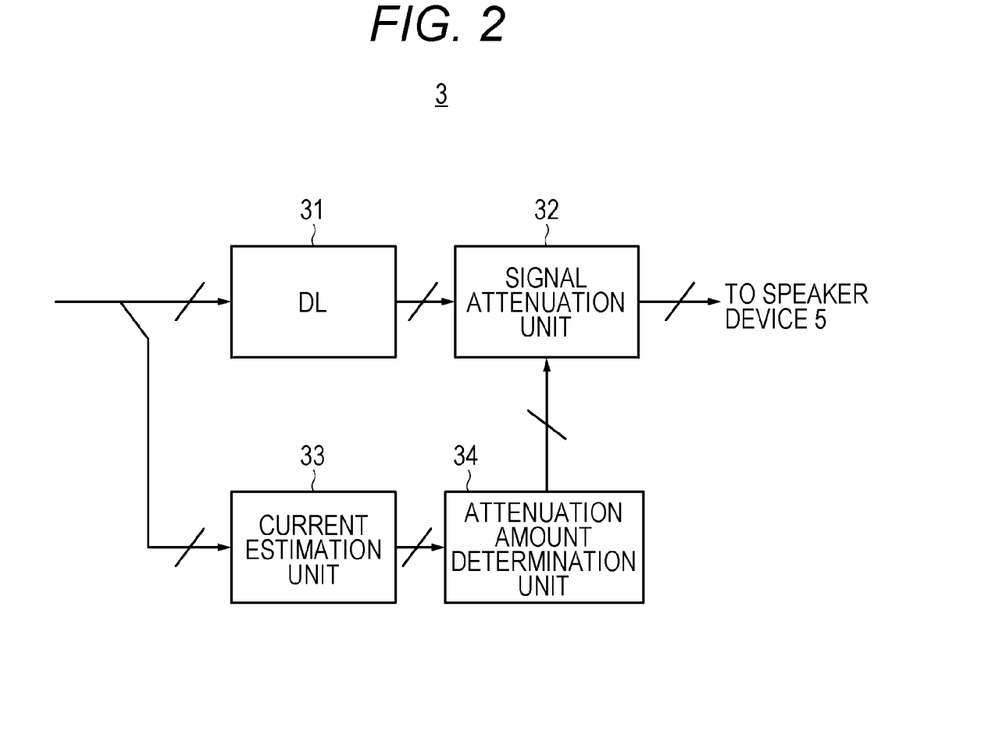
FIG. 2 is a block diagram of an example of a total current controller according to a first embodiment of the present technology.

The total current controller 3 will be described with reference to FIG. 2. The total current controller 3 supplies a signal to the speaker device 5 via a delay circuit 31 and a signal attenuation unit 32. A current estimation unit 33 estimates, from a value of audio data of each channel, a total value of currents flowing through the speaker device 5.

An output from the current estimation unit 33 is supplied to an attenuation amount determination unit 34. The attenuation amount determination unit 34 generates a control signal for controlling an attenuation amount for data of each channel so that the estimated total value of currents does not exceed a predetermined value that has been set in advance. A control signal for instructing the attenuation amount is supplied from the attenuation amount determination unit 34 to the signal attenuation unit 32.

The delay circuit 31 delays data for a period of time required to generate the control signal for controlling the attenuation amount. In the embodiment, the total current controller 3 is designed to perform control for each sample of audio data. That is, a control signal generated by the total current controller 3 is applied to target data so as to prevent any delay of one sample. A sampling period of audio data is, for example, 48 kHz. Note that, in a case where the current estimation unit 33 performs processing in a unit of one sample, the attenuation amount determination unit 34 and the signal attenuation unit 32 may perform processing in a unit (update cycle) of an optional period of time instead of for each sample. In that case, the delay circuit 31 has a delay time of that optional period of time.

Figure 3A:
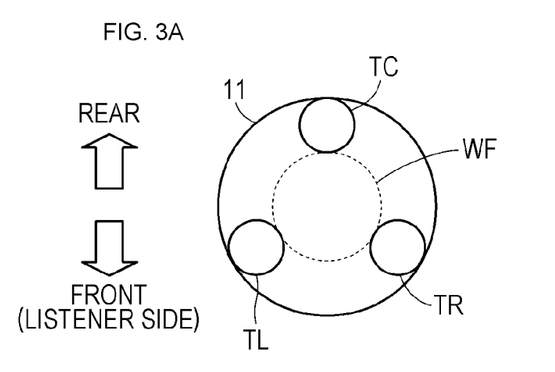
FIGS. 3A, 3B, and 3C are a top view, a perspective view, and a partial sectional view illustrating an appearance of one embodiment of the present technology.
Figure 3B:
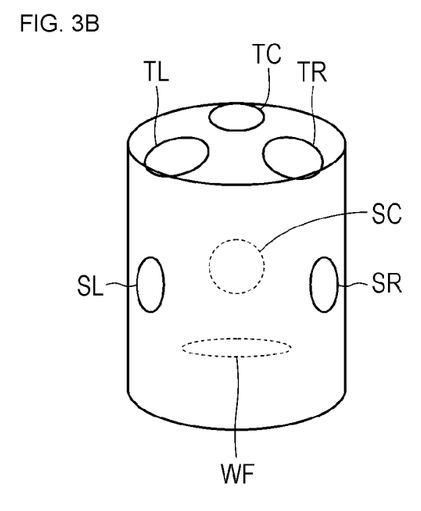
Figure 3C:
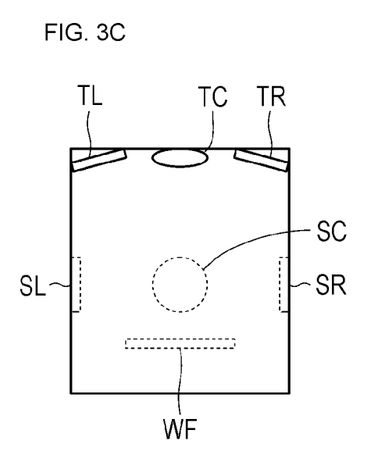

One embodiment of the present technology including the speaker device 5 will be described with reference to FIGS. 3A, 3B, and 3C. FIG. 3A is a plan view of an audio reproduction device, FIG. 3B is a perspective view of the audio reproduction device as viewed from a listener side, and FIG. 3C is a partial sectional view of the audio reproduction device as viewed from the listener side.

The top right speaker TR, the top left speaker TL, and the top center speaker TC are provided on a top surface of a cylindrical case 11 of the audio reproduction device. Sound radiation directions of these speakers are set to be slightly obliquely upward from a vertical upward direction. These speakers TR, TL, and TC contribute to sound image localization at a predetermined position in a space above the audio reproduction device.

Figure 1:
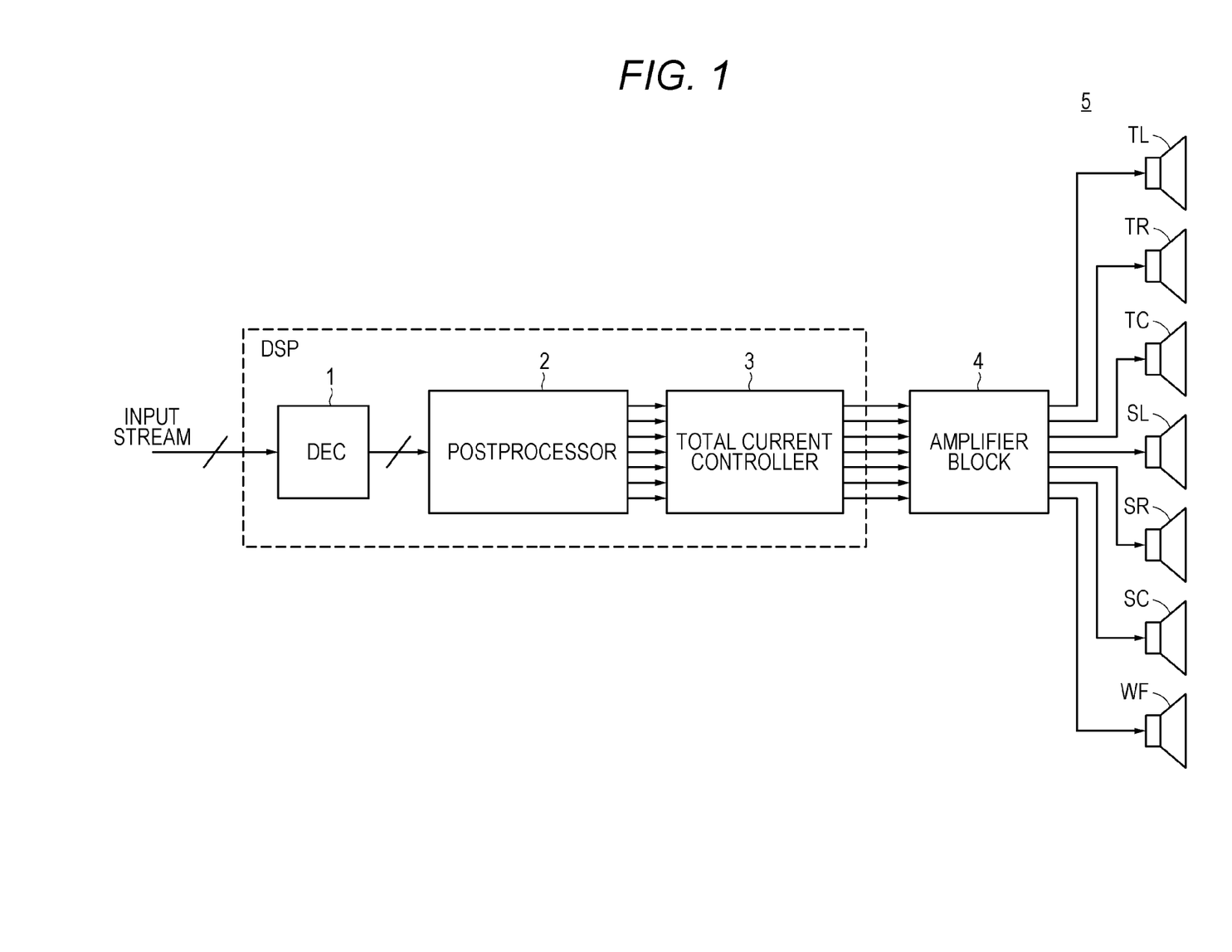
FIG. 1 is a block diagram of one embodiment of the present technology.

A circuit board provided with the electrical configuration in FIG. 1 is mounted inside the case 11. The three speakers are arranged at an angular interval of about 120°. The top left speaker TL and the top right speaker TR are positioned on the listener side. Note that the audio reproduction device has a manufacturer's logo mark on the front side thereof, and the audio reproduction device is placed so that the logo mark faces the listener side.

The side left speaker SL, the side right speaker SR, and the side center speaker SC are provided at intermediate height positions on the case 11. These three speakers are arranged at an angular interval of about 120°, and each of their sound radiation directions is set to an outward direction orthogonal to a tangent line of a peripheral surface of the case 11. The side left speaker SL and the side right speaker SR are arranged symmetrically with respect to the listener side. The woofer WF is provided on the bottom side of the case 11, and the sound radiation direction is upward. Note that a speaker arrangement other than the configuration illustrated in FIGS. 3A, 3B, and 3C may be used.

Figure 4:
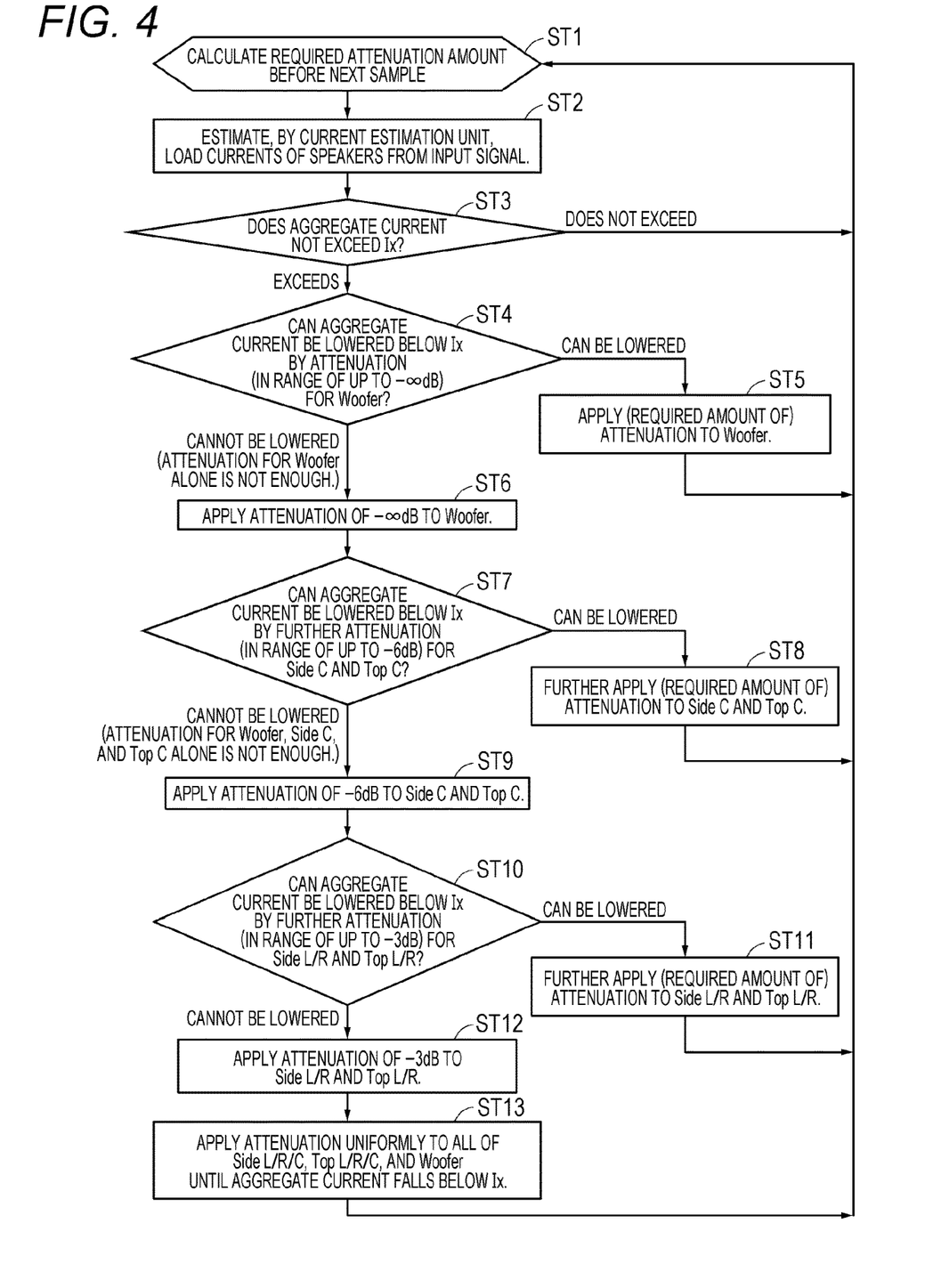
FIG. 4 is a flowchart for illustrating an example of total current control.

Processing performed by the total current controller 3 in one embodiment of the present technology will be described with reference to a flowchart in FIG. 4. The total current controller 3 performs total current control processing for each sample of audio data. A total current is a total of currents flowing through the speakers of the speaker device 5. In FIG. 4 and the following description, the total current is referred to as an aggregate current.

Step ST1: A required attenuation amount is calculated before the next sample.

Step ST2: The current estimation unit 33 estimates load currents of the speakers from multi-channel input data.

Step ST3: It is determined whether an aggregate current of the load currents does not exceed a predetermined value Ix. The predetermined value Ix is a maximum current value allowed by a power supply device used or a current value slightly smaller than the maximum current value, and is, for example, 8.2 A. In a case where it is determined that the aggregate current does not exceed the predetermined value Ix, the processing returns to step ST1 because no attenuation is required.

Step ST4: In a case where a result of the determination in step ST3 indicates that the aggregate current exceeds Ix, it is determined whether the aggregate current can be lowered below Ix by attenuation to $-\infty$ dB for the woofer WF (first determination processing). $-\infty$ dB represents an attenuation amount that changes a data value to zero.

Step ST5: In a case where it is determined in step ST4 (first determination processing) that the aggregate current value can be lowered below Ix, a required amount of attenuation is applied to a signal to be input to the woofer WF. Then, the processing returns to step ST1.

Step ST6: In a case where it is determined in step ST4 (first determination processing) that the aggregate current cannot be lowered below Ix (the attenuation for the woofer WF alone is not enough), attenuation of $-\infty$ dB is applied to a signal to be input to the woofer WF.

Step ST7: Following step ST6, it is determined whether the aggregate current can be lowered below Ix (second determination processing) by further applying attenuation (in a first range of up to $-6$ dB) to a signal to be input to a first group of a plurality of speakers (side center speaker SC and top center speaker TC). The first group includes speakers positioned substantially in the center when viewed from the listener side.

Step ST8: In a case where it is determined in step ST7 (second determination processing) that the aggregate current value can be lowered below Ix, a required amount of attenuation is applied to a signal to be input to the first group (side center speaker SC and top center speaker TC). Then, the processing returns to step ST1.

Step ST9: In a case where it is determined in step ST7 (second determination processing) that the aggregate current cannot be lowered below Ix (the attenuation for the woofer WF, the side center speaker SC, and the top center speaker TC alone is not enough), attenuation of $-6$ dB (a maximum value in the first range) is applied to a signal to be input to the first group (side center speaker SC and top center speaker TC).

Step ST10: Following step ST9, it is determined whether the aggregate current can be lowered below Ix (third determination processing) by further applying attenuation (in a second range of up to $-3$ dB) to a signal to be input to a second group (side right speaker SR and side left speaker SL, and top left speaker TL and top right speaker TR).

Step ST11: In a case where it is determined in step ST10 (third determination processing) that the aggregate current value can be lowered below Ix, a required amount of attenuation is further applied to a signal to be input to the second group (side right speaker SR and side left speaker SL, and top left speaker TL and top right speaker TR). Then, the processing returns to step ST1.

Step ST12: In a case where it is determined in step ST10 (third determination processing) that the aggregate current cannot be lowered below Ix (that is, the attenuation for the woofer WF, the side center speaker SC, the top center speaker TC, the side right speaker SR, the side left speaker SL, the top left speaker TL, and the top right speaker TR alone is not enough), attenuation of $-3$ dB (a maximum value in the second range) is applied to a signal to be input to the side right speaker SR, the side left speaker SL, the top left speaker TL, and the top right speaker TR. The maximum value in the second range is set so that the attenuation amount is smaller than that of the maximum value in the first range.

Step ST13: Attenuation is applied uniformly to a signal to be input to all the speakers until the aggregate current falls below Ix. Then, the processing returns to step ST1.

As described above, in the embodiment of the present technology, the attenuation amount is controlled in accordance with a priority that has been set in advance and the attenuation amounts are equalized within the same group, so that relationships between the channels are maintained. As a result of the attenuation amount control, it is possible to prevent intended effects of audio reproduction (realistic feeling, spatial expansion, and the like) from being impaired.

Although the embodiments of the present technology have been specifically described above, the present technology is not limited to the above-described embodiments, and various modifications may be made on the basis of the technical idea of the present technology. For example, the multi-channel speakers excluding the woofer may be divided into three or more groups. The present technology may be applied not only to seven channels but also to multi-channel audio such as 5.1 channels or 11.1 channels. Moreover, audio reproduction may be performed at the same time as video reproduction.

The configurations, methods, processes, shapes, materials, numerical values, and the like described in the above-described embodiments are merely examples, and configurations, methods, processes, shapes, materials, numerical values, and the like different from those described above may be used where necessary. The above-described embodiments and modified examples can be combined as appropriate.

The present technology can also be configured as described below.

(1)

An audio reproduction device including:
a signal processing circuit that generates multi-channel audio data;
an attenuation amount control unit that is connected to the signal processing circuit and controls an attenuation amount of audio data of each channel; and
a speaker device that is driven by a multi-channel audio signal from the attenuation amount control unit and has multi-channel speakers including a woofer,
in which the attenuation amount control unit estimates, from an audio data value of each channel, a total value of currents flowing through the speaker device, and controls the attenuation amount in such a way that the estimated total value of currents does not exceed a predetermined value that has been set in advance, and
the attenuation amount is controlled in accordance with a priority that has been set in advance in such a way that relationships between the channels are maintained.

(2)

The audio reproduction device according to (1), in which the attenuation amount control unit performs control for each sample of audio data of each channel.

(3)

The audio reproduction device according to (1) or (2), in which the multi-channel speakers are divided into the woofer and a group of a plurality of speakers excluding the woofer, attenuation of input data for the woofer is ranked first, and attenuation of input data for the group of the plurality of speakers excluding the woofer is ranked second, an attenuation amount of the input data for the woofer is set in such a way to change the input data to zero at a maximum, and attenuation amounts of the input data for the group are set to values within a range that has been set, and are substantially equal among the plurality of speakers.

(4)

The audio reproduction device according to any one of (1) to (3), in which a plurality of speakers excluding the woofer is divided into a first group and a second group, attenuation of input data for the woofer is ranked first, attenuation of input data for the first group is ranked second, and attenuation of input data for the second group is ranked third, an attenuation amount of the input data for the woofer is set in such a way to change the input data to zero at a maximum, attenuation amounts of the input data for the first group are set to values within a first range that has been set, and are substantially equal among a plurality of speakers, and attenuation amounts of the input data for the second group are set to values within a second range that has been set, and are substantially equal among a plurality of speakers.

(5)

The audio reproduction device according to (4), in which a maximum value within the second range is smaller than a maximum value within the first range.

(6)

The audio reproduction device according to (4), in which the first group contributes less to sound image localization in space than the second group.

(7)

The audio reproduction device according to (4), in which the first group includes speakers positioned substantially in center when viewed from a listener side, and the second group includes speakers positioned left and right when viewed from the listener side.

(8)

An audio reproduction device including:

a signal processing circuit that generates multi-channel audio data;

an attenuation amount control unit that is connected to the signal processing circuit and controls an attenuation amount of audio data of each channel; and a speaker device that is driven by a multi-channel audio signal from the attenuation amount control unit and has multi-channel speakers including a woofer, in which the attenuation amount control unit estimates, from an audio data value of each channel, a total value of currents flowing through the speaker device, and controls attenuation amounts in such a way that the estimated total value of currents does not exceed a predetermined value allowed by a power supply, and the attenuation amount control unit performs first determination processing for determining whether the total value of currents exceeds the predetermined value in a case where input data for the woofer is attenuated in a range of up to zero, and causes the input data for the woofer to be attenuated by a required amount in a case where it is determined that the total value of currents does not exceed the predetermined value, and performs, in a case where it is determined in the first determination processing that the total value of currents exceeds the predetermined value, second determination processing for determining whether the total value of currents exceeds the predetermined value in a case where the input data for the woofer is attenuated to substantially zero, and then input data for the speakers excluding the woofer is attenuated in a range of up to a value that has been set, and causes the input data for the speakers excluding the woofer to be attenuated by a required amount in a case where it is determined that the total value of currents does not exceed the predetermined value.

(9)

The audio reproduction device according to (8), in which a plurality of speakers excluding the woofer is divided into a first group and a second group, the second determination processing is performed on the first group, and in a case where it is determined in the second determination processing that the total value of currents exceeds the predetermined value, input data for speakers of the first group is attenuated to a maximum value within a range that has been set, and then input data for speakers of the second group is attenuated in a range of up to a value that has been set.

REFERENCE SIGNS LIST

1 Decoder
3 Total current controller
5 Speaker device
31 Delay circuit
32 Signal attenuation unit
33 Current estimation unit
34 Attenuation amount determination unit

The invention claimed is:

1. An audio reproduction device, comprising:

a signal processing circuit configured to generate multi-channel audio data;

an attenuation amount control unit that is connected to the signal processing circuit, wherein the attenuation amount control unit is configured to control an attenuation amount of audio data of each channel; and a speaker device that is driven by a multi-channel audio signal from the attenuation amount control unit, wherein the speaker device includes multi-channel speakers, the multi-channel speakers includes a woofer, the attenuation amount control unit is further configured to:

estimate, from an audio data value of each channel, a total value of currents that flows through the speaker device, and control the attenuation amount of the audio data of each channel in such a way that the estimated total value of currents does not exceed a specific value, and the attenuation amount of the audio data of each channel is controlled based on a ranking associated with each of the multi-channel speakers.

2. The audio reproduction device according to claim 1, wherein the attenuation amount control unit is further configured to control each sample of the audio data of each channel.

3. The audio reproduction device according to claim 1, wherein
the multi-channel speakers includes the woofer and a plurality of speakers excluding the woofer,
attenuation of the audio data for the woofer is ranked first,
attenuation of the audio data for the plurality of speakers excluding the woofer is ranked second,
an attenuation amount of the audio data for the woofer is set to change the audio data for the woofer to zero at a maximum, and
attenuation amounts of the audio data for the plurality of speakers is set to values within a specific range, and are substantially equal among the plurality of speakers.

4. The audio reproduction device according to claim 1, wherein
the multi-channel speakers include the woofer and a plurality of speakers excluding the woofer,
the plurality of speakers includes a first group and a second group,
attenuation of the audio data for the woofer is ranked first, attenuation of the audio data for the first group is ranked second, and attenuation of the audio data for the second group is ranked third,
an attenuation amount of the audio data for the woofer is set to change the audio data for the woofer to zero at a maximum,
attenuation amounts of the audio data for the first group are set to values within a first range, and are substantially equal among the plurality of speakers of the first group, and
attenuation amounts of the audio data for the second group are set to values within a second range, and are substantially equal among the plurality of speakers of the second group.

5. The audio reproduction device according to claim 4, wherein a maximum value within the second range is smaller than a maximum value within the first range.

6. The audio reproduction device according to claim 4, wherein the first group contributes less to sound image localization in space than the second group.

7. The audio reproduction device according to claim 4, wherein
the first group includes speakers positioned substantially in center when viewed from a listener side, and
the second group includes speakers at left and right when viewed from the listener side.

8. An audio reproduction device, comprising:
a signal processing circuit configured to generate multi-channel audio data;
an attenuation amount control unit that is connected to the signal processing circuit, wherein the attenuation amount control unit is configured to control an attenuation amount of audio data of each channel; and
a speaker device that is driven by a multi-channel audio signal from the attenuation amount control unit, wherein
the speaker device includes multi-channel speakers,
the multi-channel speakers includes a woofer,
the attenuation amount control unit is further configured to:
estimate, from an audio data value of each channel, a total value of currents that flows through the speaker device,
control attenuation amount of the audio data of each channel in such a way that the estimated total value of currents does not exceed a specific value allowed by a power supply,
perform a first determination processing operation for determination of whether the total value of currents exceeds the specific value in a case where the audio input-data for the woofer is attenuated up to zero,
cause the audio data for the woofer to be attenuated by a required amount in a case where it is determined that the total value of currents does not exceed the specific value, and
perform, in a case where it is determined in the first determination processing operation that the total value of currents exceeds the specific value, a second determination processing operation for determination of whether the total value of currents exceeds the specific value in a case where the audio data for the woofer is attenuated to substantially zero, and then the audio data for a plurality of speakers excluding the woofer is attenuated in a range of up to a value, and
cause the audio data for the plurality of speakers excluding the woofer to be attenuated by a required amount in a case where it is determined that the total value of currents does not exceed the specific value.

9. The audio reproduction device according to claim 8, wherein
the plurality of speakers excluding the woofer includes a first group and a second group,
the second determination processing operation is performed on the first group, and
in a case where it is determined in the second determination processing operation that the total value of currents exceeds the specific value, the audio data for speakers of the first group is attenuated to a maximum value within a first range, and then the audio data for speakers of the second group is attenuated in a second range of up to a value.

* * * * *